United States Patent
Narasimhan et al.

(10) Patent No.: US 12,260,349 B2
(45) Date of Patent: Mar. 25, 2025

(54) INTERACTIVE GUIDANCE SYSTEM FOR SELECTING THERMODYNAMICS METHODS IN PROCESS SIMULATIONS

(71) Applicant: AVEVA SOFTWARE, LLC, Lake Forest, CA (US)

(72) Inventors: Prasad Narasimhan, Cypress, TX (US); Seiya Hirohama, Yokohama (JP); Norbert Jung, Wiesbaden (DE)

(73) Assignee: Aveva Software, LLC, Lake Forest, CA (US)

( * ) Notice: Subject to any disclaimer, the term of this patent is extended or adjusted under 35 U.S.C. 154(b) by 1288 days.

(21) Appl. No.: 16/183,129

(22) Filed: Nov. 7, 2018

(65) Prior Publication Data

US 2019/0138921 A1 May 9, 2019

Related U.S. Application Data

(60) Provisional application No. 62/582,737, filed on Nov. 7, 2017.

(51) Int. Cl.
*G06N 5/045* (2023.01)
*G06F 30/20* (2020.01)
*G06N 5/025* (2023.01)
*G06N 20/00* (2019.01)

(52) U.S. Cl.
CPC ............. *G06N 5/045* (2013.01); *G06F 30/20* (2020.01); *G06N 5/025* (2013.01); *G06N 20/00* (2019.01)

(58) Field of Classification Search
CPC ................................ G06N 5/045; G06N 5/025
See application file for complete search history.

(56) References Cited

U.S. PATENT DOCUMENTS

| | | |
|---|---|---|
| 2009/0089227 A1 | 4/2009 | Sturrock et al. |
| 2011/0066285 A1 | 3/2011 | Xu et al. |
| 2011/0153322 A1 | 6/2011 | Kwak et al. |
| 2013/0124175 A1 | 5/2013 | McKim et al. |
| 2015/0178422 A1* | 6/2015 | McKim ............... G09B 19/003 703/6 |

(Continued)

FOREIGN PATENT DOCUMENTS

CN 104143027 A * 11/2014

OTHER PUBLICATIONS

Bieliauskas et al. A Conversational User Interface for Software Visualization IEEE Working Conference on Software Visualization Sep. 2017, pp. 139-143 (Year: 2017).*

(Continued)

*Primary Examiner* — Rehana Perveen
*Assistant Examiner* — Cuong V Luu
(74) *Attorney, Agent, or Firm* — Dergosits & Noah LLP; Todd A. Noah

(57) ABSTRACT

A simulation tool executing a simulation model and a generating an automated dialog associated therewith. The automated dialog comprises a bot configured for interacting with a user, wherein the dialog is displayed to the user. The bot is integrated with a set of rules that are referenced as a function of input received from the user for furthering the dialog and making a recommendation about the process simulation. In certain embodiments, the simulation tool is configured to select a thermodynamic method for use in a process simulation as a function of the set of rules and the user input.

16 Claims, 7 Drawing Sheets

(56) References Cited

U.S. PATENT DOCUMENTS

| | | | | |
|---|---|---|---|---|
| 2015/0348548 | A1* | 12/2015 | Piernot | G10L 15/26 |
| | | | | 704/235 |
| 2018/0129648 | A1* | 5/2018 | Chakravarthy | G06F 40/58 |
| 2019/0130244 | A1* | 5/2019 | Mars | G06N 20/20 |
| 2022/0335268 | A1* | 10/2022 | Hu | G06N 5/003 |

OTHER PUBLICATIONS

Hill et al, Understand Thermodynamics to Improve Process Simulations, Computational Methods, American Institute of Chemical Engineers (Dec. 2011) pp. 20-25.

International Search Report and Written Opinion dated Jan. 17, 2019 relating to PCT Patent Application No. PCT/US2018/059615, 9 pages.

* cited by examiner

INTERACTIVE GUIDANCE SYSTEM FOR SELECTING THERMODYNAMICS METHODS IN PROCESS SIMULATIONS

CROSS-REFERENCE TO RELATED APPLICATION

This application claims priority to U.S. Provisional Patent Application Ser. No. 62/582,737, entitled "INTERACTIVE GUIDANCE SYSTEM FOR SELECTING THERMODYNAMIC METHODS IN PROCESS SIMULATIONS" and filed Nov. 7, 2017, which is hereby incorporated by reference in its entirety.

TECHNICAL FIELD

Aspects of the present disclosure generally relate to steady state process simulation, dynamic process simulation, optimization, and related applications. More particularly, aspects relate to systems and methods for integrating an automated dialog system with a thermodynamic decision making tree in a dynamic process simulation.

BACKGROUND

Refinery, chemical or petrochemical, and other industrial processes are extremely complex and receive substantially greater volumes of information than any human could possibly digest in raw form. By way of example, it is not unheard of to have thousands of sensors (e.g., temperature, pressure, pH, mass/volume flow) and control elements (e.g., valve actuators) monitoring/controlling aspects of a multi-stage process within an industrial plant. These sensors are of varied type and report on varied characteristics of the process. Their outputs are similarly varied in the meaning of their measurements, in the amount of data sent for each measurement, and in the frequency of their measurements. As regards the latter, for accuracy and to enable quick response, some of these sensors/control elements take one or more measurements every second. Multiplying a single sensor/control element by thousands of sensors/control elements (a typical industrial control environment) results in an overwhelming volume of data flowing into the manufacturing information and process control system.

Often, sophisticated process management and control software examines the incoming data, produces status reports, and, in many cases, responds by sending commands to actuators/controllers that adjust the operation of at least a portion of the industrial process. The data produced by the sensors also allow an operator to perform a number of supervisory tasks including: tailor the process (e.g., specify new set points) in response to varying external conditions (including costs of raw materials), detect an inefficient/non-optimal operating condition and/or impending equipment failure, and take remedial actions such as move equipment into and out of service as required.

Due to the complexity of industrial processes, it is a difficult but vital task to ensure that the process is running efficiently. For example, process design tools available from AVEVA Group allow engineers to consider important design implications such as regulatory compliance, profitability, and safety, while weighing standard design practices. Simulation tools employ calculations designed to model and simulate these complex industrial processes based on thermodynamic methods, physical property data, component information, and equipment models. The use of these modeling and simulation functions allows a user to optimize the processes but requires solving large systems of equations, which can be extremely time consuming and complicated for the user.

In years past, many companies required thermodynamics specialists to develop process simulations. Even as these companies converted to commercially available process simulators, they continued to rely heavily on these specialists for using the thermodynamic methods in the simulation tools. As thermodynamics specialists become scarce, many production and engineering companies face difficulty in correctly selecting thermodynamic methods in process simulation, which requires knowledge and experience.

SUMMARY

In an aspect, a simulation tool having built-in intelligence that integrates an automated dialog system with a thermodynamic decision making tree enables a user to effectively use a process simulator without having expertise in thermodynamics.

In an aspect, a simulation tool executes a simulation model and generates an automated dialog associated therewith. The automated dialog comprises a bot configured for interacting with a user, wherein the dialog is displayed to the user. The bot is integrated with a set of rules that are referenced as a function of input received from the user for furthering the dialog and selecting a preferred thermodynamic method and dataset for use in the simulation model.

In one aspect, a process simulation tool for use in determining a thermodynamic method for a simulation of a process comprises a processor, a memory device coupled to the processor, and software instructions stored on the memory device and executable by the processor. Said instruction comprise instructions for generating an automated dialog. The automated dialog comprises a bot configured to prompt a user for information about the process. Instructions generate a user interface for displaying the dialog to the user and for receiving input from the user comprising responses to the prompting of the bot. Instructions reference a set of rules stored on the memory device and, according to the rules, further the dialog as a function of the input received from the user and make a selection of at least one thermodynamic method for the simulation of the process as a function of the input received from the user.

In another aspect, a process simulation tool for conducting a simulation of an industrial process comprises a processor, a memory device coupled to the processor, and software instructions stored on the memory device and executable by the processor. Said instructions comprise instructions for generating an automated dialog. The automated dialog comprises a bot configured to prompt a user for information about the process. Instructions generate a user interface for displaying the dialog to the user and for receiving input from the user comprising responses to the prompting of the bot. Instructions reference a set of rules stored on the memory device and, according to the rules, further the dialog as a function of the input received from the user and make a recommendation about the simulation of the process as a function of the input received from the user.

In one or more embodiments of the process simulation tool, the set of rules comprises a decision making tree integrated with the automated dialog.

In certain embodiments of the process simulation tool, the decision making tree selects explanatory information associated with the recommendation method from a knowledge base for displaying to the user.

In some embodiments of the process simulation tool, the processor-executable instructions include instructions that, when executed by the processor, implement a decision making tree file editor for modifying the rules. In one or more embodiments of the process simulation tool, the processor-executable instructions include instructions that, when executed by the processor, submit a representation of the input received from the user and the recommendation to a process simulation expert for validation. The processor-executable instructions can include instructions that, when executed by the processor, receive from the process simulation expert an expert response comprising either of a validation response validating the recommendation and an adjustment response including an adjusted recommendation. For example, the adjustment response can include rationale data including parameters used to make the adjusted recommendation. The processor-executable instructions, in certain embodiments, include instructions that, when executed by the processor, store the adjustment response on the memory device when the adjustment response is received. The processor-executable instructions can further include instructions that, when executed by the processor, aggregate received adjustment responses on the memory device. The processor-executable instructions can still further include instructions that, when executed by the processor, use a machine learning system to adjust the decision tree based on the aggregated adjustment responses stored on the memory device. For example, the machine learning system can comprise a neural network.

In some embodiments, the dialog includes one or more prompts for at least one of parameters and components of the process and the input received from the user includes one or more inputs responsive to the prompts selecting one or more of at least one of parameters and components of the process. In these embodiments, the memory device can store a database containing data for at least one of available parameters and components. The processor-executable instructions can include instructions that, when executed by the processor, query the database to determine which data for the selected one or more of at least one of parameters and components of the process are available. The processor-executable instructions can further include instructions that, when executed by the processor, adjust the recommendation based on which data for the selected one or more of at least one of parameters and components of the process are available.

In certain embodiments, the processor-executable instructions include instructions that, when executed by the processor, generates a user interface configured for receiving a simulation request input from the user requesting use of the recommendation in a process simulation. The processor-executable instructions can include instructions that, when executed by the processor, conduct a process simulation in response to receiving the simulation request using the recommendation and display a result of the process simulation to the user. In one or more embodiments, a method of developing a process comprises using the process simulation tool of to conduct the process simulation on the process simulator using the recommendation and adjusting the process based on the result of the process simulation.

In other aspects, a computer implemented method and a computer readable storage device are provided.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION

Figure 1:
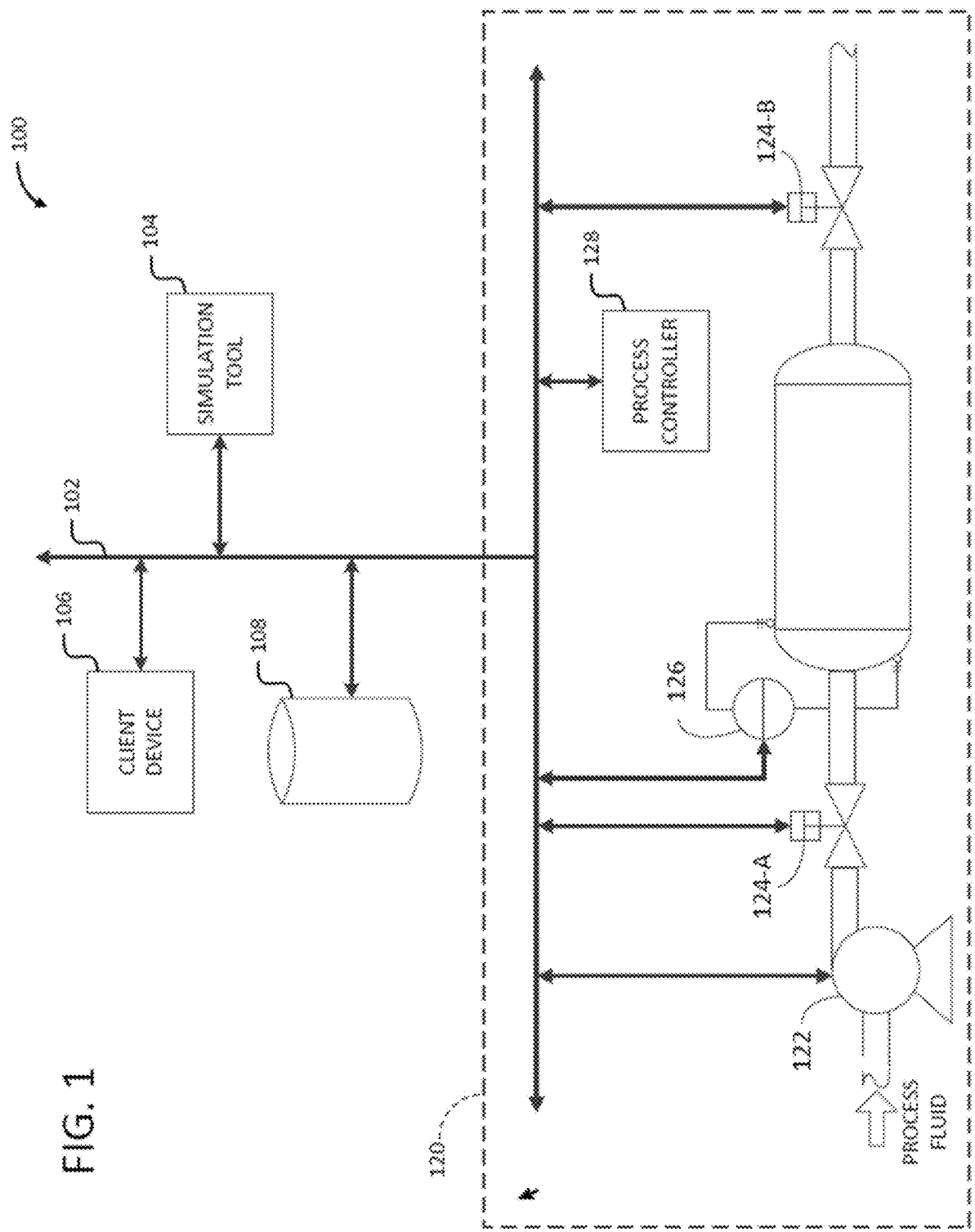
FIG. 1 is a schematic block diagram of an exemplary industrial process system within which aspects of the disclosure may be incorporated.

FIG. 1 illustrates an exemplary industrial process system, generally indicated at 100, within which an embodiment of the disclosure may be incorporated. The system 100 includes a communication infrastructure 102, a simulation tool 104, a client device 106, a computer-readable storage medium 108, and an exemplary fluid processing system 120. The fluid processing system 120 of the exemplary embodiment of FIG. 1 further includes a pump 122, valves 124, a sensor 126, and a process controller 128. In system 100, the simulation tool 104, the client device 106, the storage medium 108, and various components of the fluid processing system 120 (e.g., pump 122, valves 124, sensor 126, process controller 128) are communicatively connected via the communication infrastructure 102.

In an embodiment, simulation tool 104 includes a processor, a memory device, and an interface device that is configured to facilitate communication (e.g., via the communication infrastructure 102) with the industrial process database 108, client devices 106, the industrial fluid processing system 120, etc. In one or more embodiments, the processor and memory device of the simulation tool 104 comprise hardware situated remotely from a client device (e.g., the simulation tool 104 can be run as a cloud-based application or from a remote server). In other embodiments, the simulation tool 104 could be run as a local application on a client device 106 without departing from the scope of the invention. In certain embodiments, parts of the simulation tool are executed on hardware situated remotely from a client device and other parts of the simulation tool are run directly on the client device.

Figure 2:
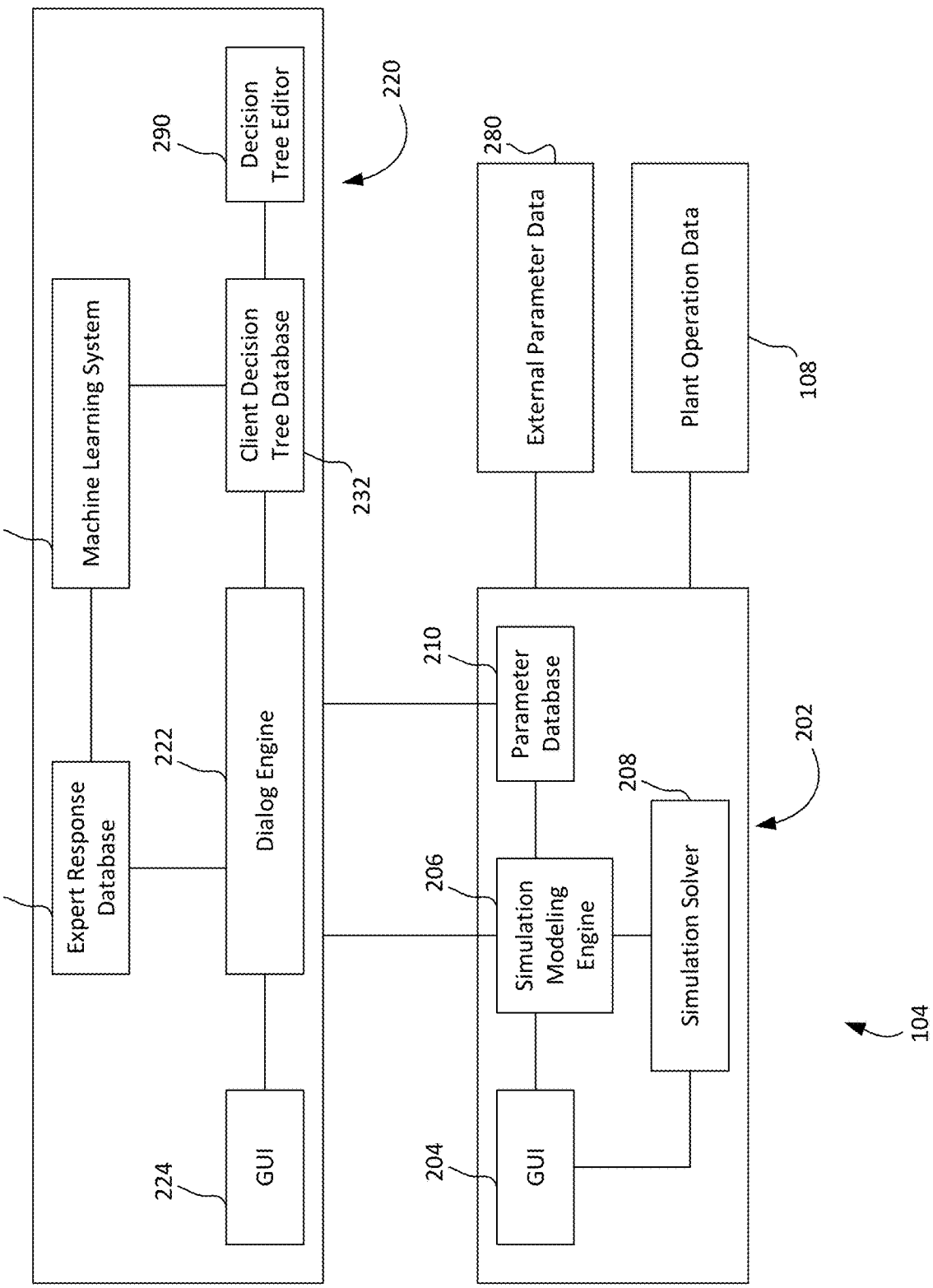
FIG. 2 is a schematic block diagram of a simulation tool for simulating the industrial process.

Referring to FIG. 2, the memory device of the simulation tool 104 includes processor-executable instructions that, when executed by the simulation tool processor, run a process simulation module 202 (e.g., a process simulator), which further includes a user interface 204 (which may be implemented on client device 106 (FIG. 1)), a modeling engine 206, and a solver or solution engine 208. The simulation modeling engine 206 and/or the simulation solver 208 can reference a database 210 of process parameters that is stored on the simulation tool memory device. For example, as will be explained in further detail below, the parameter database 210, in certain embodiments, includes thermodynamic data for certain chemical components, such as binary interaction parameters for certain thermodynamic methods. As will be understood to those skilled in the art, during a configuration time, the user interface 204 is configured to receive user input (e.g., inputs to the client device 106) that configures a simulation model representative of the process. The simulation model is stored in the simulation tool memory device, and at a simulation time, the simulation solver 208 runs (e.g., solves) one or more simulations of the process that generate a simulation result. In certain embodiments, the simulation tool 104 can be used to develop (e.g., design, configure, reconfigure, improve, etc.) the industrial process 100. For example, a user of the industrial process 100 can adjust the process (e.g., adjust certain control parameters, process inputs such as compositions, etc.) based on the results of the simulation performed by the simulation module 202.

The memory device of the simulation tool 104 also includes processor-executable instructions that, when executed by the simulation tool processor, run a local thermodynamics module 220. In general, the thermodynamics module 220 fills gaps in the knowledge of industrial process engineers and other users of a simulation module 202, which would otherwise slow the development of industrial processes and lead to inefficiencies and inaccuracies in industrial process simulation. An accurate process simulation requires an accurate thermodynamic model of the industrial process. But conventionally, users of simulators such as the simulation module 202 lack the technical expertise to accurately configure the thermodynamic properties of the simulation. So instead, such users rely on guidance from a handful of thermodynamics experts to properly configure the thermodynamic properties of each simulation. Many qualified thermodynamics experts are aging out of the workforce, and as a result, the availability of the required thermodynamics expertise is limited. Furthermore, as a result of the scarcity of thermodynamics experts, there can be delays in the provision of the thermodynamics guidance, which in turn can lead to delays and inefficiencies in the configuration of process simulations and ultimately to delays and inefficiencies in the development of an industrial process.

The thermodynamics module 220 is generally configured to address the existing deficit in thermodynamics expertise required for process simulation by imitating a thermodynamics expert. As will be explained in further detail below, in one or more embodiments, the thermodynamics module 220 is configured to conduct an automated dialog with the user that directs the user to a recommendation of a thermodynamic method for an industrial process simulation based on the relevant characteristics of the user's process. As will be explained further below, in certain embodiments, the thermodynamics module 220 is configured to account for the thermodynamic data that is available to the user and dynamically adjust the recommendation of the thermodynamic method based on the availability of thermodynamic data. As will be explained still further below, certain embodiments of the thermodynamics module 220 are configured to interface with human thermodynamics experts that validate or adjust the recommendations made by the module, and over time, use the human expert input to make adjustments to the set of rules that govern the recommendations that are made by the automated system.

The thermodynamics module 220 is but one example of the type of "simulation advisor module" that is contemplated to be within the scope of this disclosure. In general simulation advisor modules are configured to conduct an automated dialog with a simulation tool user through which the user is advised regarding one or more aspects of the process simulation (e.g., aspects pertaining to how a process simulation should be modeled or configured; how a process simulation should be executed; how to develop a process based on results of a process simulation, etc.). Based on the detailed discussion of the thermodynamics module 220 below, it will be understood that other types of simulation advisor modules in the scope of this disclosure can, for example, be configured to: reference a set of rules pertaining to the simulation and/or process that control the advancement of the simulation advisor dialog; facilitate user modifications to the set of rules for advancing the dialog; interface with human simulation experts to validate the simulation advice provided through the dialog; use a machine learning system to automatically adjust the set of rules by which the simulation advisor dialog is advanced; and/or reference internal and external data sets to evaluate the availability of pertinent data to assess what advice about the simulation and/or process to give to the user.

Referring still to FIG. 2, the features of the illustrated embodiment of a simulation advisor module 220 that is specifically configured to provide thermodynamic guidance to simulation tool users will now be described in further detail. The thermodynamics module 220 comprises processor-executable instructions that, when executed by the simulation tool processor, run a dialog engine 222 configured to generate automated dialog content. When executed by the processor, the processor-executable instructions also generate a user interface 224 configured to display the automated dialog content to the user (e.g., on one or more client devices 106) and receive responsive input from the user that the dialog engine 222 uses to advance and further the dialog. In general, the dialog engine 222 comprises a chat bot that is configured to generate prompts that prompt a user for pertinent information about the user's industrial process. For instance, the dialog engine 222 generates an automated dialog, or chat, that enables the user to have a structured, interactive "conversation" with a thermodynamics expert system that can use the user's contributions to the chat (e.g., user input) to make recommendations of thermodynamic methods to use in a simulation. The dialog engine 222 can be implemented on any suitable automated chat bot system without departing from the scope of the invention. In one or more embodiments, a SKYPE® BOT, available from Microsoft Corporation, is used to implement the dialog engine 222.

Figure 3:
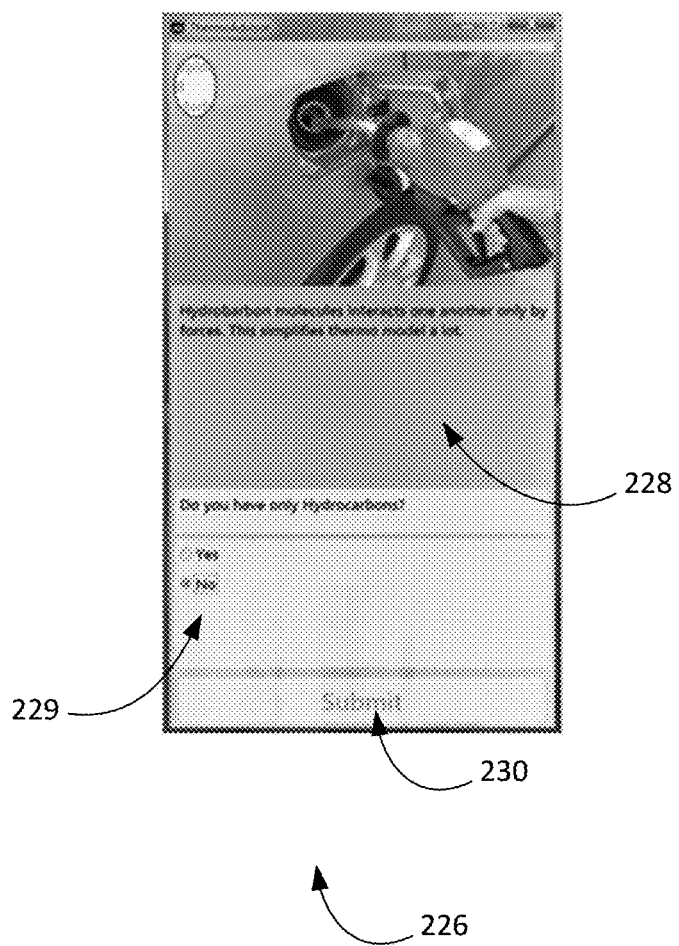
FIG. 3 is an illustrative screenshot of a chat display generated by a thermodynamics module of the simulation tool.

Referring to FIG. 3, an exemplary chat display of the user interface 224 of the thermodynamics module 220 is generally indicated at reference number 226. The chat display 226 includes a prompt field 227 that includes text stating a question (broadly, a prompt for information) about the user's process. In the illustrated embodiment, the chat display 226 further comprises a multimedia informational field 228 in which multimedia content (e.g., text, an image, a video, an audio playback icon, etc.) is presented that aids a user in understanding the content of the prompt. For instance, in the example shown the informational field 228 includes an image of a recognizable gasoline nozzle, which helps a user determine what is meant by "hydrocarbon components" in the prompt. The illustrated informational field 228 also includes text describing why, as a matter of thermodynamics, it is important to know whether the process has only hydrocarbon components. The chat display 220 further comprises a response field 229 that includes an input object (e.g., a text input field, a radio button, a checkbox, etc.) by which a user can enter the content of the user's response to the prompt. The illustrated chat display 226 still further comprises a submission field 230, which allows the user to submit the response entered in the response filed 229 and thereby advance the dialog. It will be appreciated that that a chat display can have configurations that differ from what is shown in FIG. 3 without departing from the scope of the invention.

In one or more embodiments, certain text displayed in the chat display 226 can comprise a hyperlink (broadly, a navigation item; not shown) that is selectable to navigate to a display (e.g., a webpage) with detailed information about the hyperlinked text. The detailed information can, for example, be structured and presented to teach the user thermodynamics principles and concepts that are pertinent to the prompt so that the user can make an informed response without involving a human expert. In one or more embodiments, the detailed information is displayed directly in the chat display 226 after the hyperlink is selected; in other embodiments, the hyperlink calls up a new window or application (broadly, a new display; e.g., a web browser) in which the detailed information is displayed. Other navigation or selection items besides hyperlinked text can be used to allow a user to display detailed information about aspects of the dialog without departing from the scope of the invention.

Figure 4:
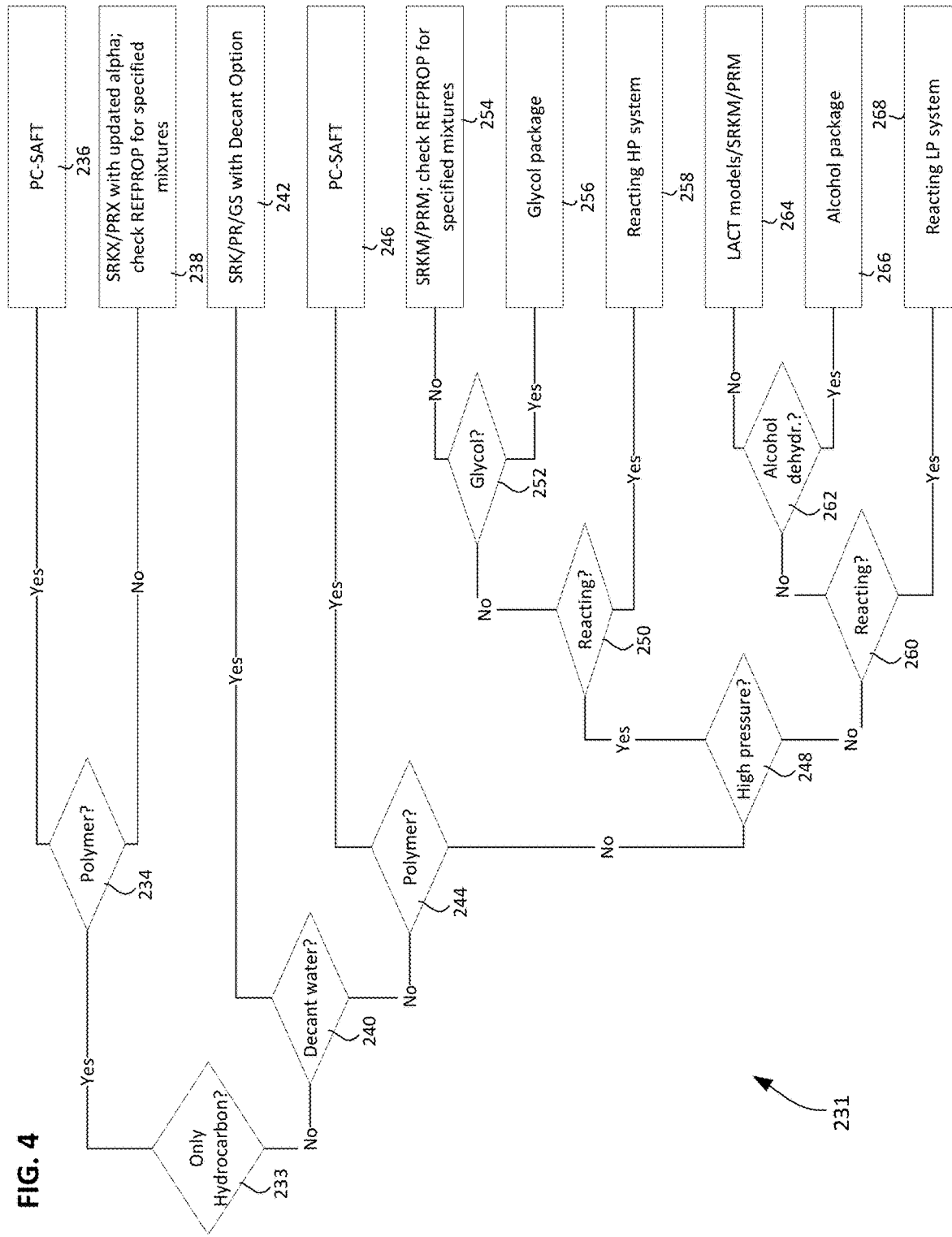
FIG. 4 is a flow chart schematically illustrating the decision points and selections of a decision tree of the thermodynamics module configured for selecting a thermodynamic method for a process simulation.

The illustrated thermodynamics module 220 further comprises processor-executable instructions that direct the dialog engine 222 to reference a set of rules stored on the memory of the simulation tool 104. By reference to and in accordance with this set of rules, and as a function of the user input during the dialog, the dialog engine 222 is configured to further the dialog and ultimately make a selection of at least one thermodynamic method for the user's simulation. Referring to FIG. 4, in one or more embodiments, the set of rules comprises a decision tree 231. In certain embodiments, each decision tree 231 is a client-specific set of rules such that, when the simulation tool 104 has multiple clients, the memory device stores a database 232 (FIG. 2) of respective decision trees for the clients. In one or more embodiments, the decision tree 231 comprises a set of rules that applies universally to all clients of the simulation tool 104. In one or more embodiments, the database 232 stores a plurality of decision trees with different sets of rules for different use cases that can be accessed by the same user or set of users. For example, a user may select between a theoretical use case associated with a decision tree developed according to thermodynamics theory or an experience-driven use case associated with a decision tree developed based on field experience and/or empirical data.

In certain embodiments, the thermodynamics module 220 is configured to streamline the dialog generated based on the decision tree 231 by importing data about the user's process from the process simulator 202. The thermodynamics module 220 can be configured to dragonize sets of simulation configuration of users by retrieving data from the process simulator 202. Based on the simulation data retrieved from the process simulator, the thermodynamics module 220 may be able to automatically provide the necessary responses to certain decision points on the decision tree 231. In some embodiments, the thermodynamics module 220 can be configured to skip past prompts in the dialog for which responses can be automatically generated based on the simulator-provided data. In one or more embodiments, the thermodynamics module 220 can be configured to ask for user confirmation of decision points for which responses are automatically generated based on the simulator-provided data.

Operation of the thermodynamics module 220 based on an exemplary embodiment of a decision tree 231 that defines a suitable set of rules for making a selection of one or more thermodynamic methods to use in a process simulation will now be briefly described in reference to FIG. 4. It will be understood, however, that in other embodiments the decision points of a decision tree will vary from what is shown and described here. In accordance with an initial decision point 233 of the decision tree 231, the thermodynamics module 220 initially prompts the user for a response to whether the process to be simulated includes only hydrocarbon components. If the user submits an input indicating that the process includes only hydrocarbon components, in accordance with a decision point 234, the thermodynamics module 220 prompts the user for a response to whether the process to be simulated includes a polymer component. If yes, the illustrated decision tree 231 yields a selection of the thermodynamic method shown in selection box 236. The thermodynamics module 220 displays a suitable representation of the selection to the user. If instead at decision point 234 the user input indicates that the process includes no polymer components, the decision tree 231 yields a selection of the thermodynamic method shown in selection box 238. Again, the thermodynamics module 220 displays a suitable representation of the selection to the user.

If at the initial decision block 233 the user input indicates that the process includes non-hydrocarbon components, in accordance with a decision point 240, the thermodynamics module 220 prompts the user for whether the process to be simulated includes a decant water component. If yes, the decision tree 231 yields a selection of the thermodynamic method shown in selection box 242, and the thermodynamics module 220 displays a suitable representation of the selected thermodynamic method to the user. If instead at decision point 240 the user input indicates that the process includes no decant water component, in accordance with decision point 244, the thermodynamics module 220 prompts the user for a response to whether the process includes a polymer component. If yes, the decision tree 231 yields a selection of the thermodynamic method shown in selection box 246, and the thermodynamics module 220 displays a suitable indication of the selected thermodynamic method to the user.

If at decision point 244, the user submits an input indicating that the process to be simulated includes no polymer component, in accordance with decision point 248, thermodynamics module 220 prompts the user for a response to whether the process operates at high pressures. If yes, in accordance with decision point 250, the thermodynamics module 220 prompts the user for a response to whether the process includes reacting components. If the input provided in response to the prompting at decision point 250 indicates that the process has no reacting components, the thermodynamics module 220 prompts the user for a response to whether the process includes a glycol component. If no, the decision tree 231 yields a selection of the thermodynamic methods shown in selection box 254; and if yes, the decision tree yields a selection of the thermodynamic method shown in selection box 256. In each case, the thermodynamics module 220 displays a suitable indication of the selected thermodynamic method to the user. If at decision point 250 the user provides input indicating that no reactive components are used in the process to be simulated, the decision tree yields a selection of the thermodynamic method shown in decision box 258 and the thermodynamics module 220 displays a suitable indication to the user.

If at decision point 248, the user submits an input indicating that the process is not a high pressure process, in accordance with decision point 260, the thermodynamics module 220 prompts the user for a response to whether the process includes reactive components. If the input provided in response to the prompting at decision point 260 indicates that the process has no reacting components, in accordance with decision block 262, the thermodynamics module 220 prompts the user for a response to whether the process involves alcohol dehydration. If no, the decision tree 231 yields a selection of the thermodynamic methods shown in selection box 264; and if yes, the decision tree yields a selection of the thermodynamic method shown in selection box 266. In each case, the thermodynamics module 220 displays a suitable indication of the selected thermodynamic method to the user. If at decision point 260 the user provides input indicating that no reactive components are used in the process to be simulated, the decision tree yields a selection of the thermodynamic method shown in decision box 268. A suitable indication of the selected thermodynamic method is displayed to the user.

It will be appreciated that, at each of the decision points 232, 234, 2340, 244, 248, 250, 252, 260, 262 and at each of the selection boxes 236, 238, 242, 246, 254, 256, 258, 264, 266, 268 of the decision tree 231, the thermodynamics module 220 can display in the chat display 226 informational content about either what is being asked by the respective prompt or the thermodynamic method(s) that have been selected. Further, at each of the decision points 232, 234, 2340, 244, 248, 250, 252, 260, 262 and at each of the selection boxes 236, 238, 242, 246, 254, 256, 258, 264, 266, 268 of the decision tree 231, the thermodynamics module 220 can generate navigation items that are selectable by user input to navigate to more detailed information about what is being asked or selected. By integrating a thermodynamic decision making tree 231 with the dialog engine 222, simulation tool 104 provides a virtual consultant for the user. In this manner, simulation tool 104 permits the user to correctly select/configure the thermodynamic method used in a process simulation.

Figure 5:
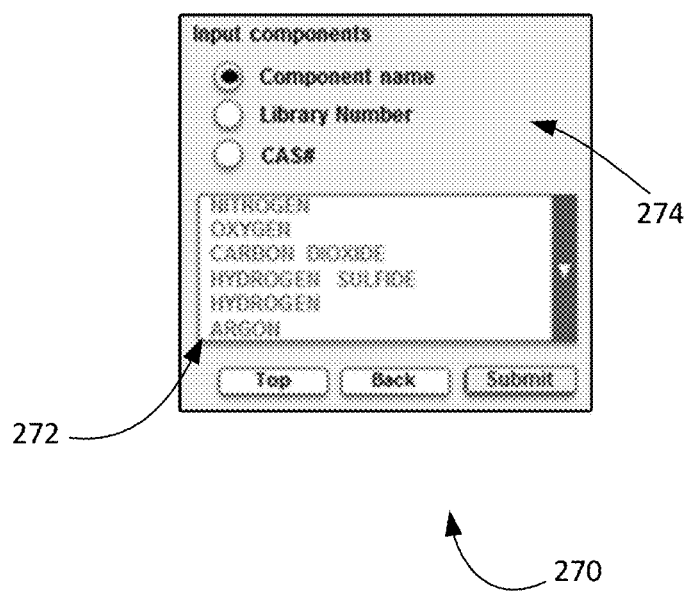
FIG. 5 is an illustrative screenshot of a component selection display generated by the thermodynamics module.

Referring again to FIG. 2, in one or more embodiments, the thermodynamics module 220 is configured to adjust the selection of the at least one thermodynamic method that was derived from the decision tree 231 based on data availability for the components of the process. After the dialog reaches one of the selection boxes 236, 238, 242, 246, 254, 256, 258, 264, 266, 268 of the decision tree 231, certain embodiments of the thermodynamics module 220 generate one or more prompts for input identifying the components used in the process to be simulated. For example, as shown in FIG. 5, in one embodiment, the thermodynamics module 220 displays to the user a component selection display, generally indicated at reference number 270, which prompts a user to select the components used in the process. In the illustrated embodiment, the component selection display 270 includes a component list 272, which comprises a list of selectable items for various components, and a component identifier type field 274, which includes selectable items for a plurality of different types of identifiers for the components. For example, the user can provide input at the field 274 that causes the components in the component list 272 to be displayed by name, library number or Chemical Abstracts Service (CAS) number. It will be appreciated that component selection displays 270 will have other configurations in other embodiments.

Based on the components that are selected by the user, the thermodynamics module 220 is configured to determine whether the thermodynamic method(s) selected by the decision tree 231 are suitable given the availability of thermodynamic data for the components of the process being simulated. In one or more embodiments, the thermodynamics module 220 is in communication with the parameter database 210 of the simulation tool 104. Suitably, processor-executable instructions are stored on the simulation tool memory device that, when executed by the simulation tool processor, cause the thermodynamics module 220 to query the parameter database 210 for available thermodynamic data for the selected process components. In certain embodiments, the thermodynamic data stored on the database 210 includes binary interaction parameter data for various chemical components. So for example, the thermodynamics module 220 is, in one or more embodiments, configured to query the database 210 for whether binary interaction parameter data for the selected thermodynamic method(s) are available for the chemical components in the process being simulated. Based on the results of the query, the thermodynamics module 220 is configured to adjust (or maintain) the selection of the thermodynamic method(s) produced by the decision tree 231. For example, if based on the decision tree 231, the thermodynamics module 220 initially selected a list of thermodynamic methods in preferred order, the thermodynamics module 220 can adjust the order of thermodynamic methods based on the availability of component data for each of the methods in the list. Similarly, if based on the decision tree 231, the thermodynamics module 220 initially selected a single thermodynamic method, the thermodynamics module can select a different thermodynamic method if data for the selected components and initially selected method is unavailable.

Referring to FIG. 2, in addition to the data stored on the simulation tool parameter database 10, the thermodynamics module 220 can be configured to consult other data sources to evaluate the availability of thermodynamic data. For example, in one or more embodiments, the thermodynamics module 220 is configured to access an external database 280 storing additional thermodynamic parameter data and/or experimental thermodynamic data for certain chemical components. It will be appreciated, that the thermodynamics module 220 can weigh the reliability and accuracy of the data stored in the databases 210, 280 when selecting thermodynamic method(s) for the process simulation.

In certain embodiments, the thermodynamics module 220 can, either automatically or upon receipt of a user request, submit the thermodynamic model selection to a human expert for validation. The thermodynamics module 220 is further configured to receive from the thermodynamics expert an expert response comprising either of a validation response validating the selection of the at least one thermodynamic method and an adjustment response adjusting the selection of the at least one thermodynamic method.

The illustrated thermodynamics module 220 includes a database 282 in which the thermodynamics module stores each of the expert responses it receives from a human expert. In one or more embodiments, the thermodynamics module 220 is configured to prompt a human expert to provide a narrative description (or other type of input that includes similar content) of the rationale for any adjustment response. The thermodynamics module 220 is configured to parse the narrative description of the rationale to identify critical parameters and values that drove the expert's selection of the thermodynamic method. As an example, a thermodynamic expert might input a narrative description of the rationale for an adjustment response that reads as follows: "We found that the objective of this simulation is operator training. Accuracy is not critical, but robustness is critical. This method requires two liquid phases only. So we recommend the SRKXXX or PRXXX methods." After parsing this narrative, the thermodynamics module 220 associates the parameters and values shown in Table 1 below with the results SRKXXX and PRXXX and stores a record of the association in the expert response database 282.

TABLE 1

Record of Parameters Associated
with SRKXXX and PRXXX Methods

| Parameters | Value |
|---|---|
| Robustness | High |
| Accuracy | Low |
| Liquid-Liquid Extraction | High |

Figure 6:
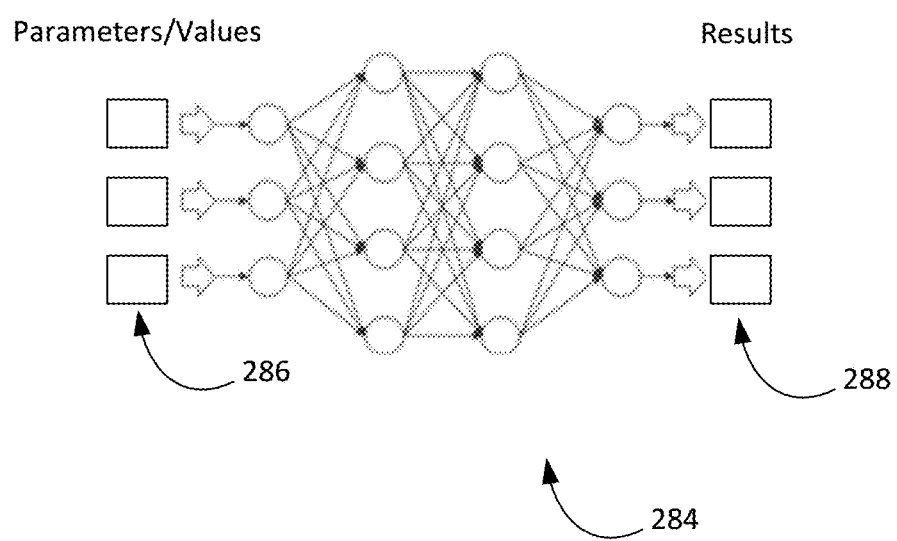
FIG. 6 is a schematic illustration of a neural network of the thermodynamics module.

In one or more embodiments, the thermodynamics module 220 comprises processor-executable instructions stored on the memory device of the simulation tool 104 that, when executed by the processor, run a machine learning system 284 that adjusts or edits the thermodynamic decision tree 231 based on the records of expert responses stored in the expert response database 282. For example, as shown schematically in FIG. 6, in certain embodiments the machine learning system 284 comprises a neural network that is configured to recognize associations between parameter values 286 and thermodynamic method results 286. When the machine learning system 284 identifies a sufficiently strong association between one or more parameter values and one or more results that is not already addressed by a decision point of the decision tree 231, it automatically edits the decision tree to include a new decision point or set of decision points that cause the thermodynamics module 220 to prompt the user for input about the strongly associated parameters during the automated dialog.

Figure 7:
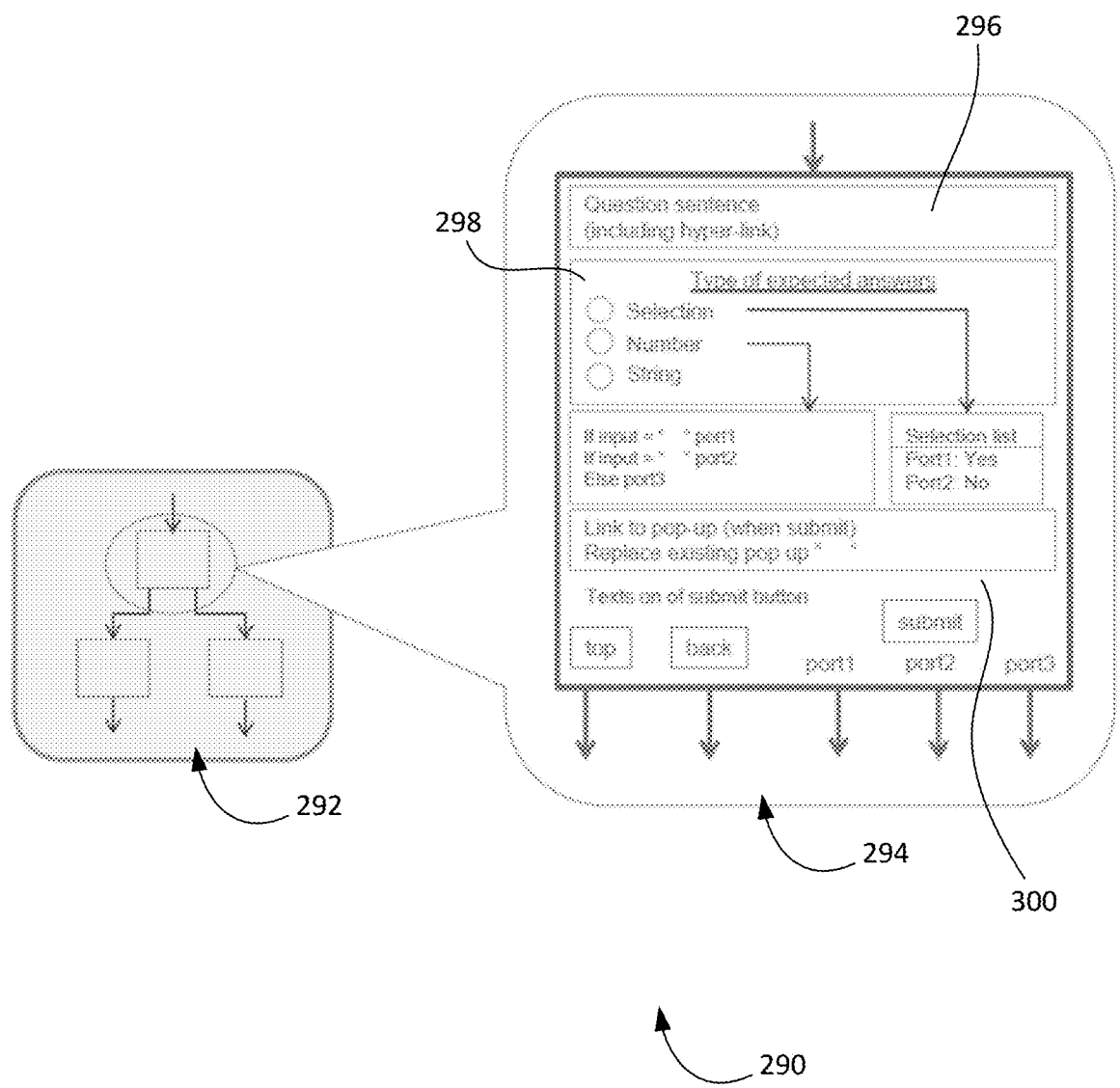
FIG. 7 is an illustrative screenshot of portions of a display associated with a decision tree editor of the thermodynamics module.

Referring again to FIG. 2, in certain embodiments the thermodynamics module 220 includes a decision tree editor 290, which allows a user of the simulation tool 104 to make adjustments to the rules that govern the decision tree. FIG. 7 illustrates portions of a display associated with the decision tree editor 290. Suitably, the editor 290 displays a graphical editor display on the client device 106 that includes a tree display portion 292 that comprises selection items for some or all of the decision points and selection boxes in the tree 231. The user can graphically select one of the selection items to edit the respective decision point or selection box, remove the respective decision point or selection box, or add a new decision point or selection box. In one or more embodiments, the editor 290 includes in the graphical editor display an item detail display portion 294. In the illustrated embodiment, the item detail display portion includes a text field 296 in which a user can edit the text of a prompt or selection of the decision tree 231; a response field 298 in which a user can configure the type, number, and content of responses to a prompt associated with a dialog decision point; and a navigation field 300 in which a user can configure the destinations of one or more selection items that are included in the chat display for the respective decision point or selection box of the decision tree. In one or more embodiments, the decision making tree 231 can comprise an exportable file (e.g., an xml file), which is configured to be edited by editor software (e.g., editor software within or separate from the simulation module 104). When external editor software is used to edit the decision making tree 231, suitably the decision making tree file 231 can be imported into the simulation module 104 after editing. It will be appreciated that decision tree editors can have configurations that differ from what is shown in FIG. 7 without departing from the scope of the invention.

Referring again to FIG. 1, the communication infrastructure 102 is capable of facilitating the exchange of data among various components of system 100, including simulation tool 104, client device 106, storage medium 108, and components of fluid processing system 120. The communication infrastructure 102 in the embodiment of FIG. 1 is a local area network (LAN) that is connectable to other telecommunications networks, including other LANs or portions of the Internet or an intranet. The communication infrastructure 102 may be any telecommunications network that facilitates the exchange of data, such as those that operate according to the IEEE 802.3 (e.g., Ethernet) and/or the IEEE 802.11 (e.g., Wi-Fi) protocols, for example. In another embodiment, communication infrastructure 102 is any medium that allows data to be physically transferred through serial or parallel communication channels (e.g., copper, wire, optical fiber, computer bus, wireless communication channel, etc.). In an embodiment, communication infrastructure 102 comprises at least in part a process control network.

The simulation tool 104 is adapted to provide steady state simulation, dynamic simulation, optimization, and other capabilities with respect to industrial and other continuous processes (e.g., fluid processing system 120). In the exemplary embodiment of FIG. 1, simulation tool 104 executes processor-executable instructions embodied on a storage memory device to provide the dynamic simulation and other capabilities via a software environment, as further described herein. In an embodiment, simulation tool 104 is any computing device capable of executing processor-executable instructions including, but not limited to, one or more servers.

Referring further to FIG. 1, the client device 106 is adapted to provide access to simulation tool 104. In an embodiment, client device 106 is a computing device that includes a graphical user interface (GUI) adapted to facilitate interaction with models, steady state simulations, dynamic simulations, optimizations, and other capabilities of simulation tool 104. In another embodiment, client device 106 includes a GUI adapted to display results of simulations performed by simulation tool 104. The client device 106 may be any computing device capable of executing processor-executable instructions including, but not limited to, personal computers, laptops, workstations, tablets, smartphones, mobile devices, and the like. Further details regarding client devices are provided in, for example, U.S. Pat. Nos. 7,676,352 and 7,987,082, each of which is hereby incorporated by reference in its entirety.

The storage medium 108 of FIG. 1 is adapted for storing and providing (e.g., receiving and transmitting) data among various components of system 100. In an exemplary embodiment, simulation tool 104, client device 106, and process controller 128 utilize storage medium 108 as a central repository for data rather than sending and receiving data directly among themselves. In an embodiment, storage medium 108 is an organized collection of data (i.e., a database) stored on storage memory devices of one or more server computing devices. In an embodiment, storage medium 108 comprises simulation tool 104. In another embodiment, storage medium 108 is provided as a "cloud" database.

Still referring to FIG. 1, the fluid processing system 120 is adapted for changing or refining raw materials to create end products. It will be apparent to one skilled in the art that aspects of the present disclosure are capable of optimizing processes and processing systems other than fluid processing system 120 and that system 120 is presented for illustration purposes only. Additional exemplary processes include, but are not limited to, those in the chemical, oil and gas, food and beverage, pharmaceutical, water treatment, and power industries. In an embodiment, process controller 128 provides an interface or gateway between components of fluid processing system 120 (e.g., pump 122, valves 124, sensor 126) and other components of system 100 (e.g., simulation tool 104, client device 106, storage medium 108). In another embodiment, components of fluid processing system 120 communicate directly with simulation tool 104, client device 106, and storage medium 108 via communication infrastructure 102. In yet another embodiment, process controller 128 transmits data to and receives data from pump 122, valves 124, and sensor 126 for controlling and/or monitoring various aspects of fluid processing system 120.

The simulation tool 104 is adapted to provide a dynamic simulation environment capable of simulating various aspects of fluid processing system 120. An exemplary simulation environment within which aspects of the present disclosure may be incorporated is provided by PRO/II™ Process Engineering, DYNSIM™ Dynamic Simulation, ROMeo™ Process Optimization, or SimCentral™ Simulation Platform, available from AVEVA Group. Further details regarding simulation modules are provided in, for example, U.S. Pat. Nos. 7,676,352, 7,987,082, and U.S. Patent Application Publication No. 2017/0115644, each of which has been incorporated by reference in its entirety.

In addition to the embodiments described above, embodiments of the present disclosure may comprise a special purpose computer including a variety of computer hardware, as described in greater detail below.

Embodiments within the scope of the present disclosure also include computer-readable media for carrying or having computer-executable instructions or data structures stored thereon. Such computer-readable media can be any available media that can be accessed by a special purpose computer and comprises computer storage media and communication media. By way of example, and not limitation, computer storage media include both volatile and nonvolatile, removable and non-removable media implemented in any method or technology for storage of information such as computer readable instructions, data structures, program modules or other data. Computer storage media are non-transitory and include, but are not limited to, random access memory (RAM), read only memory (ROM), electrically erasable programmable ROM (EEPROM), compact disk ROM (CD-ROM), digital versatile disks (DVD), or other optical disk storage, solid state drives (SSDs), magnetic cassettes, magnetic tape, magnetic disk storage, or other magnetic storage devices, or any other medium that can be used to carry or store desired non-transitory information in the form of computer-executable instructions or data structures and that can be accessed by a computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media. Computer-executable instructions comprise, for example, instructions and data which cause a general purpose computer, special purpose computer, or special purpose processing device to perform a certain function or group of functions.

The following discussion is intended to provide a brief, general description of a suitable computing environment in which aspects of the disclosure may be implemented. Although not required, aspects of the disclosure will be described in the general context of computer-executable instructions, such as program modules, being executed by computers in network environments. Generally, program modules include routines, programs, objects, components, data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represent examples of corresponding acts for implementing the functions described in such steps.

Those skilled in the art will appreciate that aspects of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Aspects of the disclosure may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

An exemplary system for implementing aspects of the disclosure includes a special purpose computing device in the form of a conventional computer, including a processing unit, a system memory, and a system bus that couples various system components including the system memory to the processing unit. The system bus may be any of several types of bus structures including a memory bus or memory controller, a peripheral bus, and a local bus using any of a variety of bus architectures. The system memory computer storage media, including nonvolatile and volatile memory types. A basic input/output system (BIOS), containing the basic routines that help transfer information between elements within the computer, such as during start-up, may be stored in ROM. Further, the computer may include any device (e.g., computer, laptop, tablet, PDA, cell phone, mobile phone, a smart television, and the like) that is capable of receiving or transmitting an IP address wirelessly to or from the internet.

The computer may also include a magnetic hard disk drive for reading from and writing to a magnetic hard disk, a magnetic disk drive for reading from or writing to a removable magnetic disk, and an optical disk drive for reading from or writing to removable optical disk such as a CD-ROM or other optical media. The magnetic hard disk drive, magnetic disk drive, and optical disk drive are connected to the system bus by a hard disk drive interface, a magnetic disk drive-interface, and an optical drive interface, respectively. The drives and their associated computer-readable media provide nonvolatile storage of computer-executable instructions, data structures, program modules, and other data for the computer. Although the exemplary environment described herein employs a magnetic hard disk, a removable magnetic disk, and a removable optical disk, other types of computer readable media for storing data can be used, including magnetic cassettes, flash memory cards, digital video disks, Bernoulli cartridges, RAMs, ROMs, SSDs, and the like.

Communication media typically embody computer readable instructions, data structures, program modules or other data in a modulated data signal such as a carrier wave or other transport mechanism and includes any information delivery media.

Program code means comprising one or more program modules may be stored on the hard disk, magnetic disk, optical disk, ROM, and/or RAM, including an operating system, one or more application programs, other program modules, and program data. A user may enter commands and information into the computer through a keyboard, pointing device, or other input device, such as a microphone, joy stick, game pad, satellite dish, scanner, or the like. These and other input devices are often connected to the processing unit through a serial port interface coupled to the system bus. Alternatively, the input devices may be connected by other interfaces, such as a parallel port, a game port, or a universal serial bus (USB). A monitor or another display device is also connected to the system bus via an interface, such as video adapter. In addition to the monitor, personal computers typically include other peripheral output devices (not shown), such as speakers and printers.

One or more aspects of the disclosure may be embodied in computer-executable instructions (i.e., software), routines, or functions stored in system memory or nonvolatile memory as application programs, program modules, and/or program data. The software may alternatively be stored remotely, such as on a remote computer with remote application programs. Generally, program modules include routines, programs, objects, components, data structures, etc. that perform particular tasks or implement particular abstract data types when executed by a processor in a computer or other device. The computer executable instructions may be stored on one or more tangible, non-transitory computer readable media (e.g., hard disk, optical disk, removable storage media, solid state memory, RAM, etc.) and executed by one or more processors or other devices. As will be appreciated by one of skill in the art, the functionality of the program modules may be combined or distributed as desired in various embodiments. In addition, the functionality may be embodied in whole or in part in firmware or hardware equivalents such as integrated circuits, application specific integrated circuits, field programmable gate arrays (FPGA), and the like.

The computer may operate in a networked environment using logical connections to one or more remote computers. The remote computers may each be another personal computer, a tablet, a PDA, a server, a router, a network PC, a peer device, or other common network node, and typically include many or all of the elements described above relative to the computer. The logical connections include a local area network (LAN) and a wide area network (WAN) that are presented here by way of example and not limitation. Such networking environments are commonplace in office-wide or enterprise-wide computer networks, intranets and the Internet.

When used in a LAN networking environment, the computer is connected to the local network through a network interface or adapter. When used in a WAN networking environment, the computer may include a modem, a wireless link, or other means for establishing communications over the wide area network, such as the Internet. The modem, which may be internal or external, is connected to the system bus via the serial port interface. In a networked environment, program modules depicted relative to the computer, or portions thereof, may be stored in the remote memory storage device. It will be appreciated that the network connections shown are exemplary and other means of establishing communications over wide area network may be used.

Preferably, computer-executable instructions are stored in a memory, such as the hard disk drive, and executed by the computer. Advantageously, the computer processor has the capability to perform all operations (e.g., execute computer-executable instructions) in real-time.

The order of execution or performance of the operations in embodiments illustrated and described herein is not essential, unless otherwise specified. That is, the operations may be performed in any order, unless otherwise specified, and embodiments may include additional or fewer operations than those disclosed herein. For example, it is contemplated that executing or performing a particular operation before, contemporaneously with, or after another operation is within the scope of aspects of the disclosure.

Embodiments may be implemented with computer-executable instructions. The computer-executable instructions may be organized into one or more computer-executable components or modules. Aspects of the disclosure may be implemented with any number and organization of such components or modules. For example, aspects of the disclosure are not limited to the specific computer-executable instructions or the specific components or modules illustrated in the figures and described herein. Other embodiments may include different computer-executable instructions or components having more or less functionality than illustrated and described herein.

When introducing elements of aspects of the disclosure or the embodiments thereof, the articles "a", "an", "the" and "said" are intended to mean that there are one or more of the elements. The terms "comprising", "including", and "having" are intended to be inclusive and mean that there may be additional elements other than the listed elements.

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A process simulation tool for use in determining a thermodynamic method for a simulation of an industrial process, the tool comprising:
   a processor;
   a memory device coupled to the processor;
   software instructions stored on the memory device, which when executed, cause the processor to:
   generate an automated dialog on display of a user automated device to prompt a user for information about the industrial process in response to execution of a simulation model using the simulation tool;
   receive responsive inputs from the user in response to the prompting, each of the responsive user inputs including at least a characteristic of the industrial process;
   generate, in response to the responsive user inputs, further prompts to the user based on a decision tree within a set of rules stored in the memory of the simulation tool, the set of rules pertaining to the simulation model;
   display decision points in the decision tree on the user device, the decision points being selectable for editing;
   determine at least one thermodynamic method for the simulation model of the industrial process based on the responsive user inputs and any of the decision points in the decision tree, including any edited decision points.

2. The process simulation tool of claim 1, further causing the processor to:
submit a representation of the responsive user inputs and the selection of the at least one thermodynamic method to a thermodynamics expert for validation.

3. The simulation tool of claim 2, further causing the processor to:
receive, from the thermodynamics expert, an expert response comprising either a validation response validating the selection of the at least one thermodynamic method or an adjustment response adjusting the selection of the at least one thermodynamic method, the adjustment response including an expert-adjusted selection of at least one thermodynamic method for the simulation of the process and rationale data including parameters used to make the expert-adjusted selection.

4. The process simulation tool of claim 3, further causing the processor to:
store the adjustment response on the memory device when the adjustment response is received.

5. The process simulation tool of claim 4, further causing the processor to: aggregate the received adjustment responses on the memory device and use a machine learning system to adjust the decision tree based on the aggregated adjustment responses stored on the memory device.

6. The process simulation tool of claim 1, further causing the processor to:
receive a responsive user input selecting one or more components of the industrial process in response to a prompt;
query the component database storing data for available components to determine which data for the one or more selected components of the process are available; and
adjust the selection of at least one thermodynamic method based on which data for the one or more selected components of the process are available.

7. The process simulation tool of claim 1, further causing the processor to:
conduct a process simulation in response to the received simulation request using the at least one thermodynamic method and display a result of the process simulation to the user.

8. A method of developing a process comprising using the process simulation tool of claim 7 to conduct the process simulation on the process simulator using the requested thermodynamic method and adjusting the process based on the result of the process simulation.

9. A process simulation tool for conducting a simulation of an industrial process, the tool comprising:
a processor;
a memory device coupled to the processor;
software instructions stored on the memory device, which when executed, cause the processor to:
generate an automated dialog on display of a user device to prompt a user for information about the industrial process in response to execution of a simulation model using the simulation tool;
receive responsive inputs from the user in response to the prompting, each of the responsive user inputs including at least a characteristic of the industrial process;
generate, in response to the responsive user inputs, further prompts to the user based on a decision tree within a set of rules stored in the memory of the simulation tool, the set of rules pertaining to the simulation model;
select at least one thermodynamic method for the simulation model of the industrial process based on the responsive user inputs and any of the decision points in the decision tree; and
adjust the selection of the at least one thermodynamic method based on availability of thermodynamic data for a component of the industrial process associated with the at least one selected thermodynamic method.

10. The process simulation tool of claim 9, further causing the processor to:
submit a representation of the responsive user inputs and the selection of the at least one thermodynamic method to a thermodynamics expert for validation.

11. The simulation tool of claim 10, further causing the processor to:
receive from the process simulation expert an expert response comprising a validation response validating the recommendation or an adjustment response comprising an adjusted recommendation,
the adjustment response includes rationale data including parameters used to make the adjusted recommendation.

12. The process simulation tool of claim 11, further causing the processor to:
store the adjustment response on the memory device when the adjustment response is received.

13. The process simulation tool of claim 12,
further causing the processor to: aggregate the received adjustment responses on the memory device; and
use a machine learning system to adjust the decision tree based on the aggregated adjustment responses stored on the memory device.

14. The process simulation tool of claim 9, further causing the processor to:
receive a responsive user input selecting at least one parameter or component of the industrial process in response to a prompt;
query the database storing data of available parameters and available components of the industrial process to determine which data for the selected one or more of at least one of parameters and components of the process are available; and
adjust the recommendation based on which data for the selected one or more of at least one of parameters and components of the process are available.

15. The process simulation tool of claim 9, further causing the processor to:
conduct a process simulation in response to the received simulation request using the at least one thermodynamic method and display a result of the process simulation to the user.

16. A method of developing a process comprising using the process simulation tool of claim 15 to conduct the process simulation on the process simulator using the recommendation and adjusting the process based on the result of the process simulation.

* * * * *